(12) United States Patent
Sugimoto et al.

(10) Patent No.: US 10,765,047 B2
(45) Date of Patent: Sep. 1, 2020

(54) FEEDER DEVICE AND COMPONENT MOUNTING MACHINE (71) Applicant: FUJI CORPORATION, Chiryu-shi (JP)

(72) Inventors: Koichiro Sugimoto, Anjo (JP); Akira Takahashi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 209 days.

(21) Appl. No.: 15/558,455

(22) PCT Filed: Jun. 23, 2015

(86) PCT No.: PCT/JP2015/068012
§ 371 (c)(1),
(2) Date: Sep. 14, 2017

(87) PCT Pub. No.: WO2016/147425
PCT Pub. Date: Sep. 22, 2016

(65) Prior Publication Data
US 2018/0054929 A1 Feb. 22, 2018

(30) Foreign Application Priority Data

Mar. 18, 2015 (WO) .................. PCT/JP2015/058059

(51) Int. Cl.
*H05K 13/02* (2006.01)
*H05K 13/08* (2006.01)
*H05K 13/04* (2006.01)

(52) U.S. Cl.
CPC ......... *H05K 13/02* (2013.01); *H05K 13/0408* (2013.01); *H05K 13/0417* (2013.01);
(Continued)

(58) Field of Classification Search
CPC .. H05K 13/02; H05K 13/086; H05K 13/0409; H05K 13/0419; H05K 13/0408;
(Continued)

(56) References Cited

U.S. PATENT DOCUMENTS

2003/0072644 A1  4/2003  Yamamura et al.
2015/0110588 A1  4/2015  Ohyama et al.

FOREIGN PATENT DOCUMENTS

JP  2003-124688 A  4/2003
JP  2005-184031 A  7/2005
(Continued)

OTHER PUBLICATIONS

International Search Report dated Aug. 25, 2015, in PCT/JP2015/068012 filed Jun. 23, 2015.

*Primary Examiner* — Livius R. Cazan
(74) *Attorney, Agent, or Firm* — Oblon, McClelland, Maier & Neustadt, L.L.P.

(57) ABSTRACT

A feeder device including a tape feeding mechanism which feeds out a carrier tape which stores components in corresponding multiple component storage sections and a cover tape which is adhered to the bottom tape and covers the component storage sections, and a tape peeling mechanism which includes a tape peeling blade which proceeds between the bottom tape and the cover tape as the carrier tape is fed out to perform peeling, the feeder device supplying the components from the component storage sections at a component supply position, and the feeder device further including a feed speed determination section which determines the feed speed at a peeling start time at which a leading end of the carrier tape comes into contact with the tape peeling blade according to at least one of properties of multiple types of carrier tape and characteristics of the components which are stored.

6 Claims, 9 Drawing Sheets

(52) U.S. Cl.
CPC ......... *H05K 13/0419* (2018.08); *H05K 13/08* (2013.01); *H05K 13/086* (2018.08); *H05K 2203/0264* (2013.01); *Y10T 29/4913* (2015.01); *Y10T 29/53174* (2015.01); *Y10T 29/53191* (2015.01)

(58) Field of Classification Search
CPC .......................... H05K 13/0417; H05K 13/08; Y10T 29/4913; Y10T 29/53174; Y10T 29/53191
See application file for complete search history.

(56) References Cited

FOREIGN PATENT DOCUMENTS

| | | | |
|---|---|---|---|
| JP | 2006-49337 | A | 2/2006 |
| JP | 2011-181816 | A | 9/2011 |
| JP | 2011181816 | A * | 9/2011 |
| JP | 2014-11315 | A | 1/2014 |

* cited by examiner

FEEDER DEVICE AND COMPONENT MOUNTING MACHINE

TECHNICAL FIELD

The present application relates to a feeder device which feeds out a carrier tape and supplies components and to a component mounting machine which is equipped with the feeder device. More specifically, the present disclosure relates to an improvement in reliability of a tape peeling operation of peeling a cover tape from a bottom tape which configures a carrier tape.

BACKGROUND ART

Examples of facilities which produce a board onto which multiple components are mounted include a solder printing machine, a component mounting machine, a reflow machine, and a board inspection machine. It is common to join these facilities to configure a board production line. Of these, the component mounting machine is provided with a board conveyance device, a component supply device, a component transfer device, and a control device. A feeder device of a system in which a carrier tape which accommodates and holds multiple components at a predetermined pitch is fed out is a representative example of a component supply device. The carrier tape is formed from a bottom tape which stores components in multiple corresponding component storage sections and a cover tape which is adhered to the bottom tape and covers the component storage sections. A splicing method in which joining work of the next carrier tape is performed and an auto loading method in which the next carrier tape is loaded automatically are put to practical use as handling methods when the carrier tape is used up to the tail end. The technical examples relating to this kind of feeder device are disclosed in PTL 1.

An electronic component mounting device of PTL 1 discloses a splicing method feeder device, and in a case in which a joining tape which joins storage tapes (carrier tapes) to each other is at a component pickup position, a feed driving source of the storage tape is controlled to decelerate. Accordingly, it is presumed to be possible to stabilize the suction operation of the electronic components at a connecting part at which the storage tapes are connected to each other and to improve productivity.

CITATION LIST

Patent Literature

PTL 1: JP-A-2006-49337

SUMMARY

Technical Problem

Incidentally, since the splicing method is targeted, the technology of PTL 1 may not be applied to an auto loading method feeder device. In an auto loading method feeder device, when the leading end of the carrier tape is loaded, the peeling is automatically started by a tape peeling blade which enters between the bottom tape and the cover tape. In the related art, the feed speed of the carrier tape when starting the peeling is fixed regardless of the type of the carrier tape. Therefore, depending on the type of the carrier tape, there is a case in which the peeling is not started due to the feed speed being fast. In this case, recovery work by an operator becomes necessary. Since starting of the peeling becomes difficult when the resilience (the mechanical rigidity) of the carrier tape is weak, in the auto loading method feeder device, there are restrictions on the types of carrier tape and component which may be used.

The present disclosure is made in consideration of the problems of the background art, and an object of the present disclosure is to provide a feeder device and a component mounting machine in which the success rate of the peeling start at the leading end of the carrier tape is increased and the work efficiency at a usage start time of the carrier tape.

Solution to Problem

A feeder device of the present disclosure which solves the problems includes a tape feeding mechanism which feeds out, at a feed speed, a carrier tape which is formed from a bottom tape which stores components in corresponding multiple component storage sections and a cover tape which is adhered to the bottom tape and covers the component storage sections, and a tape peeling mechanism which includes a tape peeling blade which proceeds between the bottom tape and the cover tape as the carrier tape is fed out to perform peeling, the feeder device supplying the components from the component storage sections at a component supply position, and the feeder device further including a feed speed determination section which determines the feed speed at a peeling start time at which a leading end of the carrier tape comes into contact with the tape peeling blade according to at least one of properties of multiple types of carrier tape and characteristics of the components which are stored.

A component mounting machine of the present disclosure includes the feeder device, a component transfer device which includes amounting head which has a suction nozzle which sucks the components at the component supply position and mounts the components onto a board, and a head driving mechanism which drives the mounting head, a peeling start determination section which determines whether or not the tape peeling blade enters between the bottom tape and the cover tape and the peeling is started, and a recovery function section which carries out a recovery operation of once returning the leading end of the carrier tape to in front of the tape peeling blade and feeding out the leading end of the carrier tape again in a case in which the peeling start determination section determines that the peeling is not started.

Advantageous Effects

The feeder device of the present disclosure is provided with the feed speed determination section which determines the feed speed at a peeling start time at which a leading end of the carrier tape comes into contact with the tape peeling blade according to at least one of properties of multiple types of carrier tape and characteristics of the components which are stored. Therefore, it is possible to adjust the feed speed at the peeling start time according to the types of the carrier tape, and it is possible to increase the success rate of the peeling start. Furthermore, since opportunities for the peeling to fail and the operator to perform recovery work are reduced, the work efficiency at the usage start time of the carrier tape is increased.

Since the component mounting machine of the present disclosure is provided with the peeling start determination section and the recovery function section, hypothetically, even if the peeling fails, the recovery operation is automatically performed and the success rate of the peeling start is further increased.

DESCRIPTION OF EMBODIMENTS

1. Overall Configuration of Component Mounting Machine 1 of Embodiment

Figure 1:
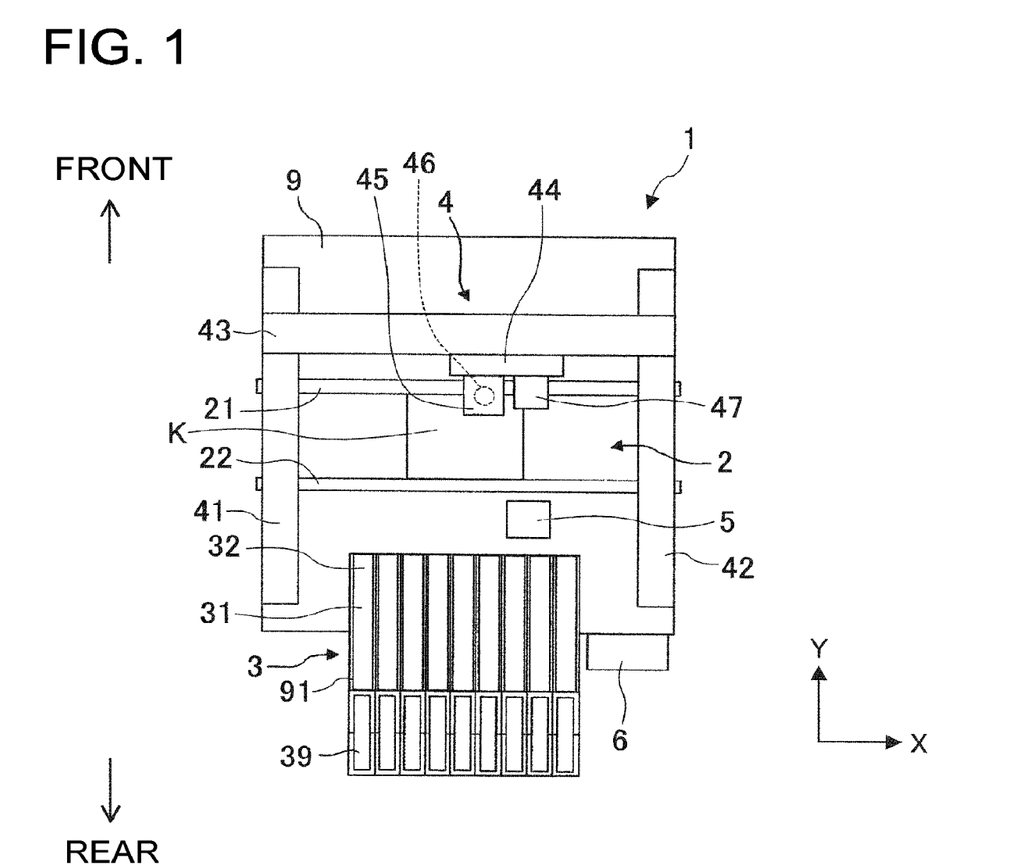
FIG. 1 is a plan view illustrating the overall configuration of a component mounting machine of an embodiment.

Description will be given of the overall configuration of the component mounting machine 1 of the embodiment of the present disclosure with reference to FIG. 1. FIG. 1 is a plan view illustrating the overall configuration of the component mounting machine 1 of the embodiment. The direction from the left side of the paper surface to the right side in FIG. 1 is the X-axis direction in which a board K is carried in and out, and the direction from the rear bottom side of the paper surface to the front top side of the paper surface is the Y-axis direction. The component mounting machine 1 is configured by a board conveyance device 2, multiple feeder devices 3, a component transfer device 4, a component camera 5, a control device 6, and the like being assembled onto a device table 9. The board conveyance device 2, each of the feeder devices 3, the component transfer device 4, and the component camera 5 are controlled from the control device 6 and each performs predetermined work.

The board conveyance device 2 carries in the board K to a mounting execution position, positions the board K, and carries out the board K. The board conveyance device 2 is configured by a pair of guide rails 21 and 22, a pair of conveyor belts, a backup device, and the like. The pair of guide rails 21 and 22 cross the center of the upper face of the device table 9 to extend in the conveyance direction (the X-axis direction) and are assembled onto the device table 9 in parallel to each other. The pair of endless loop-shaped conveyor belts which are not illustrated are provided in parallel on the inside of the pair of guide rails 21 and 22 which face each other. The pair of conveyor belts rotate in a state in which the two sides of the board K which are opposite each other are placed on conveyor conveyance surfaces, and carries in and carries out the board K to and from the mounting execution position which is set to the center portion of the device table 9. A backup device which is not visible in the diagram is arranged below the mounting execution position. The backup device pushes up the board K, clamps the board K in a horizontal posture, and positions the board K at the mounting execution position. Accordingly, the component transfer device 4 can perform the mounting operation at the mounting execution position.

Each of the multiple feeder devices 3 sequentially supplies components. The multiple feeder devices 3 are shaped to be flat and to be small in the width direction dimension and are lined up and equipped on a pallet table 91 of the upper face of the device table 9. Each of the feeder devices 3 includes a main body section 31, a tape reel 39 which is provided on the rear portion of the main body section 31, a component supply position 32 which is provided on the top portion of the vicinity of the front end of the main body section 31, and the like. A carrier tape 8 (refer to FIGS. 3 to 6) is wound and held on the tape reel 39. The carrier tape 8 is fed out by a predetermined pitch at a time, the storage states of the components are released, and the components are sequentially supplied to the component supply position 32. The feeder device 3 is an embodiment of the feeder device of the present disclosure and the detailed configuration thereof will be described later.

The component transfer device 4 sucks and picks the components from each of the component supply positions 32 of the multiple feeder devices 3, conveys the components to the positioned board K and mounts the components thereon. The component transfer device 4 is an XY-robot type of device capable of horizontal movement in the X-axis direction and the Y-axis direction. The component transfer device 4 is configured by a pair of Y-axis rails 41 and 42 which configure the head driving mechanism, a Y-axis slider 43, a mounting head 44, a nozzle tool 45, a suction nozzle 46, a board camera 47, and the like. The pair of Y-axis rails 41 and 42 are disposed close to both of the side faces of the device table 9 to extend in the front-rear direction (the Y-axis direction). The Y-axis slider 43 bridges over the Y-axis rails 41 and 42 to be capable of moving. The Y-axis slider 43 is driven in the Y-axis direction by a Y-axis ball screw mechanism which is not illustrated.

The mounting head 44 is attached to the Y-axis slider 43 to be capable of moving. The mounting head 44 is driven in the X-axis direction by an X-axis ball screw mechanism which is not illustrated. The nozzle tool 45 is held by the mounting head 44 in an exchangeable manner. The nozzle tool 45 holds one or multiple suction nozzles 46 which suck the components and mount the components onto the board K. The board camera 47 is provided on the mounting head 44 next to the nozzle tool 45. The board camera 47 images a position fiducial mark which is attached to the board K and detects the accurate position of the board K.

The component camera 5 is provided to face upward on the upper face of the device table 9 between the board conveyance device 2 and the feeder device 3. The component camera 5 images the state of the component which is sucked by the suction nozzle 46 while the mounting head 44 is in the middle of moving to above the board K from the feeder device 3. When an error in the suction posture, deviation in the rotational angle, or the like of the component becomes apparent due to the captured image data of the component camera 5, the control device 6 performs minute adjustment to the component mounting operation as necessary, and in a case in which the mounting is difficult, performs control in which the relevant component is discarded.

The control device 6 is assembled onto the device table 9, and the installation position is not particularly limited. The control device 6 holds a mounting sequence which specifies the types and the mounting order of the components to be mounted onto the board K, the feeder devices 3 that supply the relevant components, and the like. The control device 6 controls the component mounting operation according to the mounting sequence based on the captured image data of the board camera 47 and the component camera 5, the detection data of a sensor which is not illustrated, and the like. The control device 6 successively collects and updates operation condition data such as the production number of the boards K for which production is complete, the mounting time required for the mounting of the components, the occurrence number of suction errors of the components, and the like. The control device 6 is provided with a display section for displaying information to the operator and an input section for performing input setting by the operator.

The control device 6 accomplishes the function of the feed speed determination section of the present disclosure. Furthermore, the control device 6 performs the process flow which is described later to accomplish the functions of the peeling start determination section, the recovery function section, and the recovery speed determination section.

2. Detailed Configuration of Feeder Device 3 of Embodiment

Figure 2:
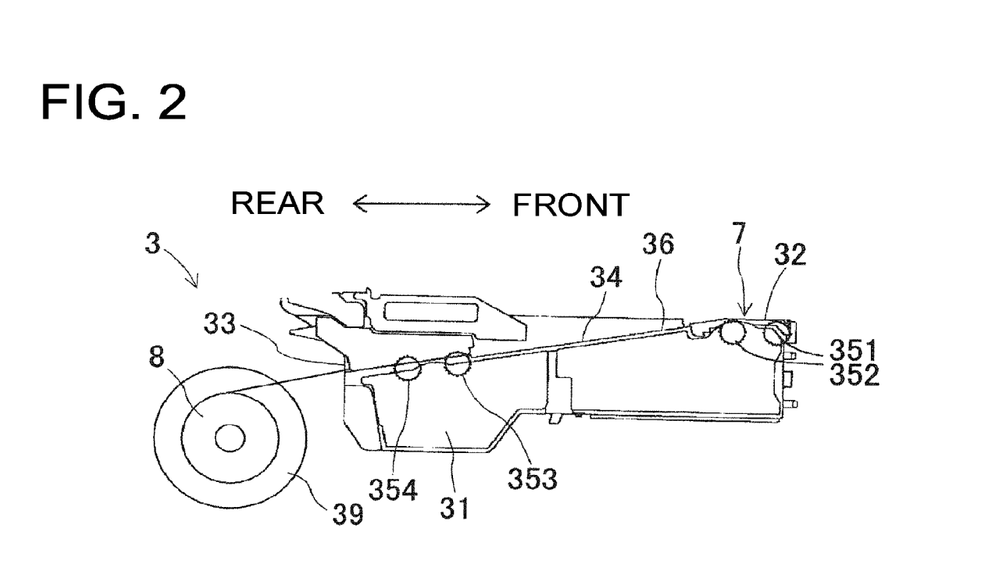
FIG. 2 is a side view of a feeder device of the embodiment.

Next, description will be given of the detailed configuration of the feeder device 3 of the embodiment. FIG. 2 is a side view of the feeder device 3 of the embodiment. The feeder device 3 includes a tape insertion port 33 in the vicinity of an intermediate height of the tail end of the main body section 31. A feeding rail 34 is installed from the tape insertion port 33 toward the top portion of the front end of the main body section 31. The component supply position 32 is set on the upper face of the vicinity of the front end of the feeding rail 34. The tape peeling mechanism 7 is installed on the rear of the component supply position 32. A tape detection sensor 36 is installed on the top side of the feeding rail 34 of the rear of the tape peeling mechanism 7. The tape detection sensor 36 detects the presence or the absence of the carrier tape 8 at a sensor installation position.

A first and a second sprockets 351 and 352 are axially supported on the bottom side of the feeding rail 34 on the front and the rear of the component supply position 32 to be capable of rotating. The teeth of the first and the second sprockets 351 and 352 protrude from a groove which is formed in the feeding rail 34 to fit into sprocket holes 84 (refer to FIGS. 3 to 6) of the carrier tape 8. The first and the second sprockets 351 and 352 are driven in synchronization by a front side servomotor which is not illustrated and can be switched between forward rotation and reverse rotation.

A third and a fourth sprockets 353 and 354 are axially supported on the bottom side close to the rear near the tape insertion port 33 of the feeding rail 34 to be capable of rotating. The teeth of the third and the fourth sprockets 353 and 354 protrude from a groove which is formed in the feeding rail 34 to fit into the sprocket holes 84 of the carrier tape 8. The third and the fourth sprockets 353 and 354 are driven in synchronization by a rear side servomotor which is not illustrated and can be switched between forward rotation and reverse rotation. The tape feeding mechanism is configured by the feeding rail 34, the first to the fourth sprockets 351 to 354, the front side and the rear side servomotors, and the like.

The tape reel 39 which is wound onto the carrier tape 8 is supported on the rear of the tape insertion port 33 of the feeder device 3 to be capable of rotating. In tape loading work, the operator pulls out the leading end of the carrier tape 8 from the tape reel 39 and inserts the leading end of the carrier tape 8 into the fourth sprocket 354 from the tape insertion port 33. Therefore, the third and the fourth sprockets 353 and 354 are driven to rotate forward and the carrier tape 8 is fed out. When the leading end of the carrier tape 8 reaches the second sprocket 352, the first and the second sprockets 351 and 352 are driven to rotate forward and the carrier tape 8 is fed out to the component supply position 32. This is the automatic loading function of the carrier tape 8. Splicing work of connecting two carrier tapes 8 becomes unnecessary due to the automatic loading function which the feeder device 3 has.

When the first to the fourth sprockets 351 to 354 are driven to rotate in reverse, the carrier tape 8 is returned to the front side, and finally, the carrier tape 8 is discharged to the rear of the fourth sprocket 354. This is the automatic discharge function of the carrier tape 8. After the carrier tape 8 is loaded, the first to the fourth sprockets 351 to 354 are driven to rotate forward by pitch feeding. Accordingly, the carrier tape 8 sequentially supplies the components at the component supply position 32.

3. Configuration and Peeling Operation of Tape Peeling Mechanism 7

Figure 3:
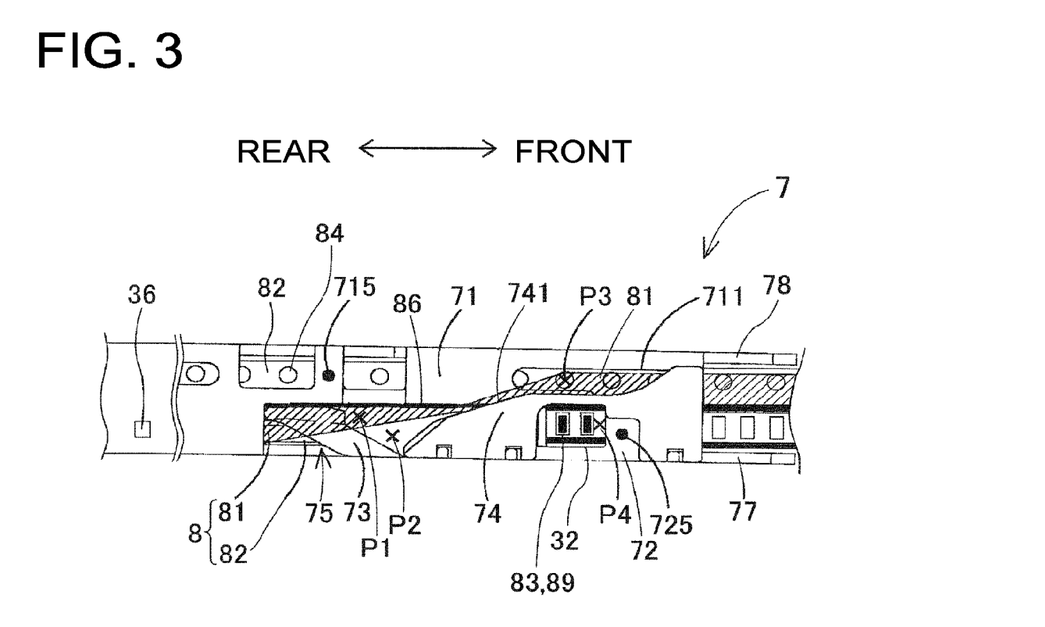
FIG. 3 is a plan view explaining the configuration and a peeling operation of a tape peeling mechanism.
Figure 4:
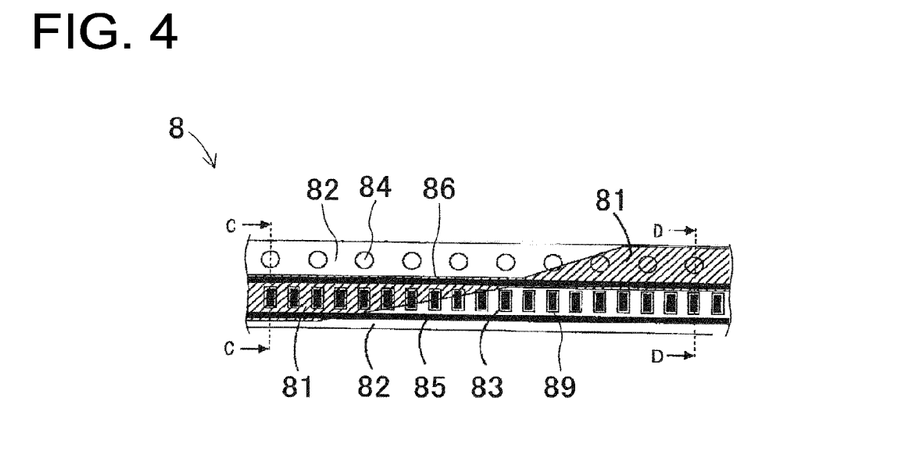
FIG. 4 is a plan view illustrating only a carrier tape which is in FIG. 3.
Figure 5:
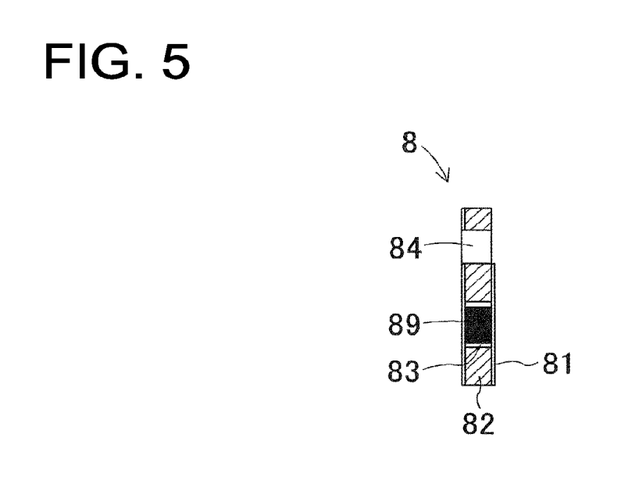
FIG. 5 is a sectional view of the carrier tape in a C-C arrow view direction of FIG. 4.
Figure 6:
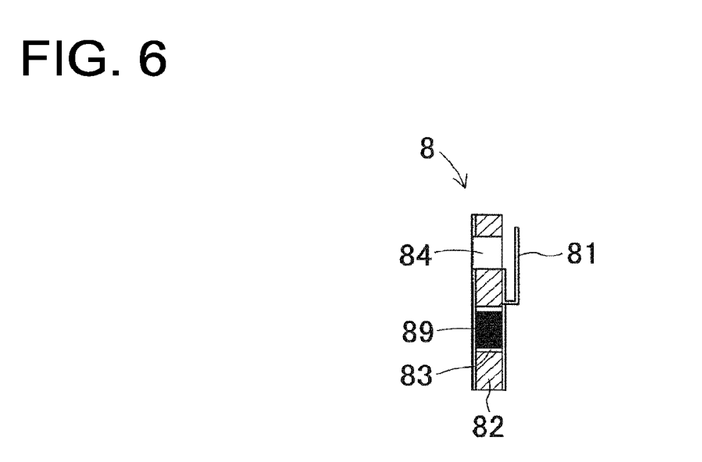
FIG. 6 is a sectional view of the carrier tape in a D-D arrow view direction of FIG. 4, and a state in which a cover tape is folded back is illustrated.

Next, description will be given of the configuration of the tape peeling mechanism 7. FIG. 3 is a plan view explaining the configuration and the peeling operation of the tape peeling mechanism 7. FIG. 4 is a plan view illustrating only the carrier tape 8 which is in FIG. 3. FIGS. 3 and 4 illustrate a cover tape 81 which configures the carrier tape 8 by applying hatching for convenience. Adhesive sections 85 and 86 and components 89 are illustrated as solid black for convenience. FIG. 5 is a sectional view of the carrier tape 8 in the C-C arrow view direction of FIG. 4. FIG. 6 is a sectional view of the carrier tape 8 in the D-D arrow view direction of FIG. 4, and a state in which the cover tape 81 is folded back is illustrated.

As illustrated in FIGS. 4 to 6, the carrier tape 8 is formed from the cover tape 81 and a bottom tape 82. The bottom tape 82 is formed by subjecting a substantially fixed thickness tape made of paper to processing and a thin film tape being bonded to the bottom face. Multiple rectangular component storage sections 83 are provided at an equal pitch in the tape length direction at a position close to one side edge from the center of the bottom tape 82 in the tape width direction. The corresponding components 89 are stored and held in each of the component storage sections 83. Multiple sprocket holes 84 are opened at an equal pitch in the tape length direction at a position close to the other side edge of the bottom tape 82.

The cover tape 81 (illustrated by hatching in FIGS. 3 and 4) which is made of a thin film is adhered to the upper face of the bottom tape 82 to be capable of being peeled. Specifically, the adhesive section 85 (illustrated as solid black in FIGS. 3 and 4) which extends in the tape length direction is set between the component storage section 83 and the one side edge of the bottom tape 82. The adhesive section 86 (illustrated as solid black in FIGS. 3 and 4) which extends in the tape length direction is set between the component storage sections 83 and the sprocket holes 84 of the bottom tape 82. The portions which are close to both edges of the cover tape 81 are adhered to the two adhesive sections 85 and 86. The cover tape 81 has a smaller width dimension than the bottom tape 82 and covers the component storage section 83; however, the cover tape 81 does not cover the sprocket holes 84.

As illustrated in FIG. 3, the tape peeling mechanism 7 is configured by two side plates 77 and 78, a first tape guide 71, a second tape guide 72, a tape peeling blade 73, a tape fold-back plate 74, and the like. The first tape guide 71 and the second tape guide 72 are thin plate-shaped members and are installed separated to the top side of the feeding rail 34 in parallel. The separation dimensions of the first tape guide 71 and the second tape guide 72 and the feeding rail 34 are slightly greater than the thickness of the carrier tape 8. The carrier tape 8 passes through a space of the separation dimensions.

The rear portion of the first tape guide 71 bridges across the space between the two side plates 77 and 78 to occupy the entire width. The front portion of the first tape guide 71 is disposed close to the other side plate 78. An elliptical sprocket hole window 711 which renders the sprocket holes 84 of the carrier tape 8 visible is formed close to the front of the first tape guide 71. Cutout windows (reference numerals omitted) which render the carrier tape 8 visible are also formed in multiple other positions of the first tape guide 71. A position mark 715 which serves as a positional reference is attached to the upper face of the first tape guide 71.

The second tape guide 72 is disposed lined up near the front of the first tape guide 71 and is attached to the one side plate 77. A portion of the second tape guide 72 corresponding to the component supply position 32 is cut out. A position mark 725 which serves as a positional reference is attached to the upper face of the second tape guide 72. An opening portion 75 which extends in the front-rear direction is formed between the first tape guide 71 and the second tape guide 72. The front side of the opening portion 75 is narrowly open in the width direction between the first and the second tape guides 71 and 72 and leads to the component supply position 32. The rear side of the opening portion 75 is formed between the first tape guide 71 and the one side plate 77 and is opened widely in the width direction.

The tape peeling blade 73 is attached to overhang in the width direction from the one side plate 77 and is disposed on the rear side of the opening portion 75. The tape peeling blade 73 is formed such that the width of the leading end is vertically thin and the width of the tail is wide and vertically thick. The tape peeling blade 73 is disposed to face the carrier tape 8 with the leading end facing rearward. Furthermore, the installation height of the tape peeling blade 73 is adjusted and the leading end thereof enters between the bottom tape 82 and the cover tape 81.

The tape fold-back plate 74 continues from the tail of the tape peeling blade 73 and is installed to overhang from the one side plate 77 in the width direction. The tape fold-back plate 74 is disposed to be separated to the top side of the first tape guide 71 and the second tape guide 72 in parallel. The tape fold-back plate 74 has a tapered side edge 741 and gradually widens toward the front distancing from the tape peeling blade 73 such that it is possible to fold back the cover tape 81 and open the component storage section 83. The separation dimension between the tape fold-back plate 74 and the first tape guide 71 is adjusted such that the folding back of the cover tape 81 is performed favorably. A portion of the tape fold-back plate 74 corresponding to the component supply position 32 is cut out.

Next, description will be given of the peeling operation of the tape peeling mechanism 7. When the leading end of the carrier tape 8 is fed out toward the tape peeling mechanism 7, the leading end of the carrier tape 8 and the tape peeling blade 73 face each other. When the carrier tape 8 is fed out and comes into contact with the tape peeling blade 73, the tape peeling blade 73 enters between the bottom tape 82 and the cover tape 81 and proceeds between both of the tapes 82 and 81. In the present embodiment, the tape peeling blade 73 peels the one adhesive section 85 and does not peel the other adhesive section 86. Therefore, the cover tape 81 is fed out in a state in which the one adhesive section 85 is peeled and the other adhesive section 86 is adhered.

The cover tape 81 stands up to above the other adhesive section 86 along the side face of the tape peeling blade 73 as the cover tape 81 proceeds from the rear side to the front side of the opening portion 75. Furthermore, the cover tape 81 is folded back in the direction of the other side plate 78 along the tapered side edge 741 of the tape fold-back plate 74. Finally, the cover tape 81 enters a folded back state which is illustrated in FIG. 6 at the component supply position 32. Accordingly, the top portion of the component storage section 83 is opened and the suction of the component 89 becomes possible. After the suction of the component 89, the carrier tape 8 is discharged to the front of the feeder device 3 in a state in which the cover tape 81 remains adhered to the bottom tape 82.

Figure 7:
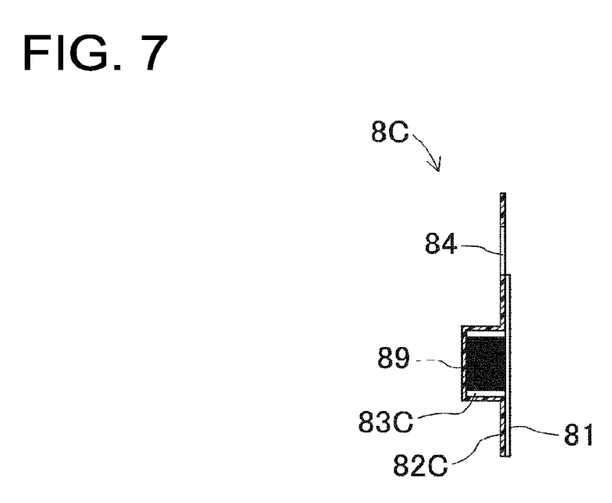
FIG. 7 is a sectional view in which an embossed carrier tape is cut in a width direction.

Next, description will be given, by example, of an embossed carrier tape 8C which differs in type from the carrier tape 8. FIG. 7 is a sectional view in which the embossed carrier tape 8C is cut in the width direction. The embossed carrier tape 8C is also formed from the cover tape 81 and a bottom tape 82C. The bottom tape 82C is formed using a tape which is made from resin and has a degree of thickness. Component storage sections 83C are provided at an equal pitch in the tape length direction and subjected to an expansion process at a position close to one side edge from the center of the bottom tape 82C in the tape width direction. In the embossed carrier tape 8C, the cover tape 81, the sprocket holes 84, and the two adhesive sections 85 and 86 are the same as in the carrier tape 8. Therefore, the embossed carrier tape 8C has inter-compatibility with the carrier tape 8 and is loaded in the feeder device 3.

Here, the thickness of the carrier tape 8 is selected, as appropriate, from among multiple types according to the height of the components 89. A carrier tape 8A which is relatively thick has a strong resilience, in other words, the mechanical rigidity is high. A carrier tape 8B which is relatively thin has a weaker resilience than the thick carrier tape 8A and a stronger resilience than the embossed carrier tape 8C. The embossed carrier tape 8C has the weakest resilience, in other words, the mechanical rigidity is low. The strengths of the resilience of the carrier tapes 8A, 8B, and 8C are defined by the shape, material, thickness, width dimensions, and the like thereof.

The strengths of the resilience of the carrier tapes 8A, 8B, and 8C influence the success rate of the peeling start. Generally, there is a tendency for the success rate of the peeling start to increase when the resilience of the carrier tapes 8A, 8B, and 8C is strong, and the success rate of the peeling start to decrease when the resilience is weak. Even in the embossed carrier tape 8C which has a weak resilience, if a feed speed V at the peeling start time is decreased, the success rate of the peeling start improves.

4. Functions and Actions of Feed Speed Determination Section and Tape Feeding Mechanism Next, in the feeder device 3 of the embodiment, description will be given of the functions of the feed speed determination section which is accomplished by the control device 6. The control device 6 performs overall management of the types of the carrier tapes 8A, 8B, and 8C which are loaded into the respective multiple feeder devices 3 and the types of the components 89. The control device 6 determines the feed speed V at the peeling start time at which the leading ends of the carrier tapes SA, 8B, and 8C come into contact with the tape peeling blade 73 according to the shapes, materials, thicknesses, and width dimensions of the multiple types of the carrier tapes 8A, 8B, and 8C.

In the embodiment, the control device 6 sets the feed speed V of the thick carrier tape 8A to a great feed speed VH and sets the feed speed V of the thin carrier tape 8B to an approximately medium feed speed VM. The control device 6 sets the feed speed V of the embossed carrier tape 8C to a small feed speed VL.

Figure 8:
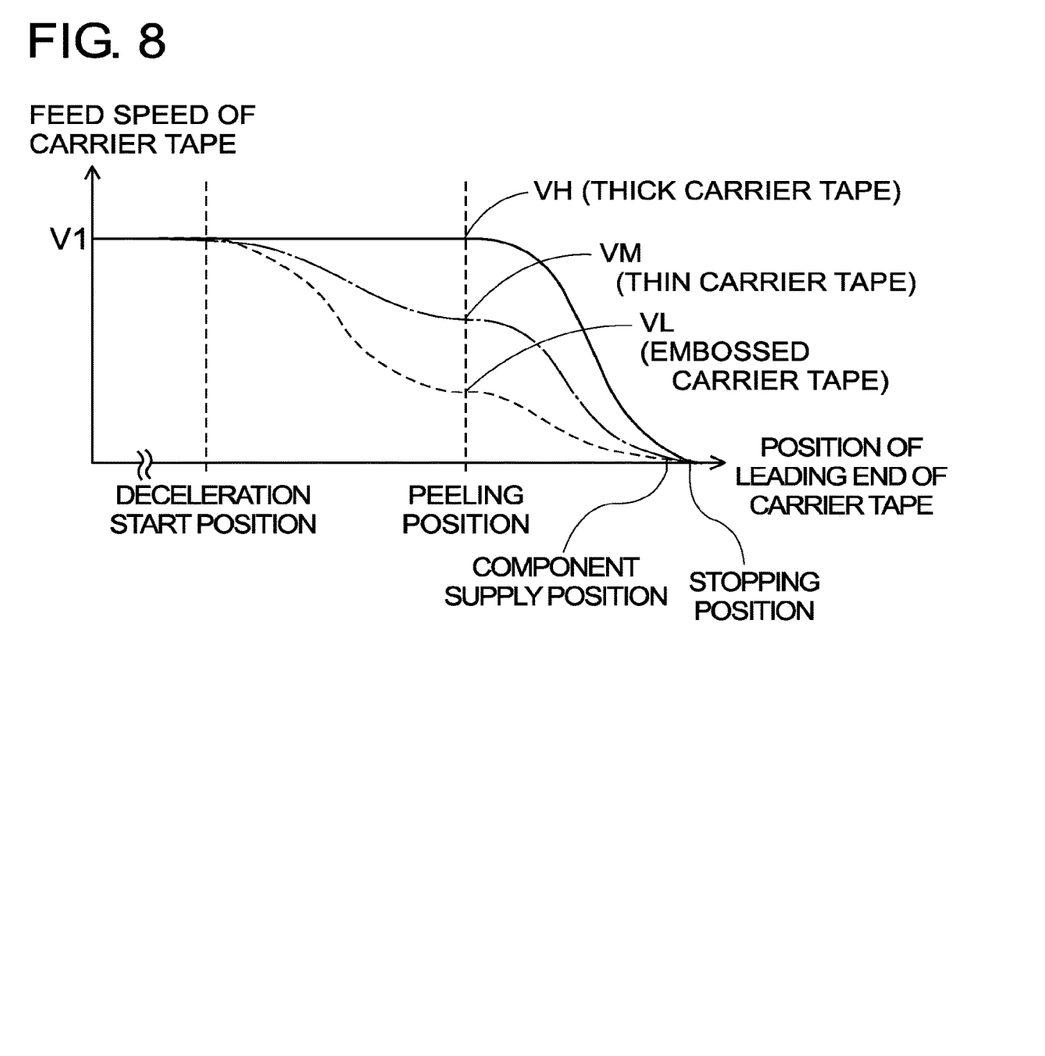
FIG. 8 is a diagram illustrating a state in which a tape feeding mechanism performs speed adjustment based on a feed speed at a peeling start time which is determined by a control device.

FIG. 8 is a diagram illustrating a state in which the tape feeding mechanism performs speed adjustment based on the feed speeds VH, VM, and VL at the peeling start time which is determined by the control device 6. The horizontal axis of FIG. 8 illustrates the position of the leading ends of the carrier tapes 8A, 8B, and 8C. In other words, in order from the rear to the front, the deceleration start position, the peeling position, the component supply position 32, and the stopping position are illustrated. For example, the installation position of the tape detection sensor 36 is exemplified as the deceleration start position. The peeling position represents the position of the leading end which faces the rear of the tape peeling blade 73. The stopping position is a position attained by proceeding to the front from the component supply position 32 by the distance between the leading ends of the carrier tapes 8A, 8B, and 8C and the first component storage sections 83 and 83C.

The vertical axis of FIG. 8 illustrates the feed speeds of the carrier tapes 8A, 8B, and 8C. Of the three speed curved lines illustrated in FIG. 8, the solid line illustrates the carrier tape 8A, the single dot dashed line illustrates the thin carrier tape 8B, and the dashed line illustrates the embossed carrier tape 8C. The tape feeding mechanism uses a feed speed V1 of a predetermined magnitude until the leading end reaches the deceleration start position regardless of the type of the carrier tapes 8A, 8B, and 8C. When the leading end passes the deceleration start position, the feed speed changes according to the type of the carrier tapes 8A, 8B, and 8C.

In other words, in the thick carrier tape 8A, the predetermined feed speed V1 barely decelerates even if the leading end passes the deceleration start position and becomes the great feed speed VH at the peeling position. Subsequently, when the leading end passes the peeling position, the great feed speed VH decelerates and the leading end of the carrier tape SA stops at the stopping position. In the thin carrier tape 8B, when the leading end passes the deceleration start position, the predetermined feed speed V1 decelerates and becomes the approximately medium feed speed VM at the peeling position. In the embossed carrier tape 8C, when the leading end passes the deceleration start position, the predetermined feed speed V1 greatly decelerates and becomes the small feed speed Vt at the peeling position. Therefore, the tape feeding mechanism functions as the feed speed deceleration section of the present disclosure with respect to the thin carrier tape 8B and the embossed carrier tape 8C.

Meanwhile, in the related art, the feed speed V at the peeling start time is set to remain at the predetermined feed speed V1 regardless of the type of the carrier tapes 8A, 8B, and 8C. In contrast, in the feeder device 3 of the embodiment, since the feed speed V at the peeling start of the carrier tape 8B in which the resilience has a medium degree of strength and the embossed carrier tape 8C in which the resilience is weak is decelerated to the approximately medium or the small feed speeds VM or VL, the success rate at the peeling start is higher than in the related art.

The control device 6 may determine the feed speed V at the peeling start time based on the characteristics of the components 89, for example, the unit cost of the components 89. Hypothetically, when a failure occurs at the start of the peeling, there is a concern that the components 89 of a range of several components from the leading ends of the carrier tapes 8A, 8B, and 8C become unusable and losses occur. Therefore, in a case in which the unit cost of the components 89 is high, it is possible to reduce economic losses by carefully determining the feed speed V at the peeling start time to be small. For example, even with the thick carrier tape 8A, in a case in which the unit cost of the components 89 is high, the control device 6 may adopt the approximately medium feed speed VM.

5. Modes and Effects of Feeder Device 3 of Embodiment

The feeder device 3 of the embodiment includes the tape feeding mechanism which feeds out, at a feed speed, the carrier tape 8, 8A, 8B, or 8C which is formed from the bottom tape 82 or 82C which stores the components 89 in the corresponding multiple component storage sections 83 or 83C and the cover tape 81 which is adhered to the bottom tape 82 or 82C and covers the component storage sections 83 or 83C, and the tape peeling mechanism 7 which includes the tape peeling blade 73 which proceeds between the bottom tape 82 or 82C and the cover tape 81 as the carrier tape 8, 8A, 8B, or 8C is fed out to perform peeling, the feeder device 3 supplying the components 89 from the component storage sections 83 or 83C at the component supply position 32, and the feeder device 3 further including the feed speed determination section (the function of the control device 6) which determines the feed speed V at a peeling start time at which the leading end of the carrier tape 8, 8A, 8B, or 8C comes into contact with the tape peeling blade 73 according to at least one of properties of multiple types of the carrier tape 8, 8A, 8B, or 8C and characteristics of the components 89 which are stored.

Accordingly, it is possible to adjust the feed speed V at the peeling start time in three levels (VH, VM, and VL) according to the types of the carrier tapes 8, 8A, 8B, and 8C, and it is possible to increase the success rate of the peeling start. Furthermore, since opportunities for the peeling to fail and the operator to perform recovery work are reduced, the work efficiency at the usage start time of the carrier tapes 8, 8A, 8B, and 8C is increased. Since it becomes possible to use carrier tapes in which starting the peeling is difficult and which could not be used in the related art, the breadth of types of component which can be supplied is widened.

Furthermore, the properties of the carrier tapes 8, 8A, 8B, and 8C include the shape, the material, the thickness, and the width dimension of the carrier tapes 8, 8A, 8B, and 8C, and the characteristics of the component 89 include the unit cost of the component 89. Accordingly, since it is possible to suitably adjust the feed speed V at the peeling start time in consideration of the strength of the resilience or the like of the carrier tapes 8, 8A, 8B, and 8C which influences the success rate of the peeling start, it is possible to notably increase the success rate of the peeling start. Since it is possible to suitably adjust the feed speed V at the peeling start time in consideration of losses and the like of the components 89, it is possible to reduce economic losses.

Furthermore, the feed speed determination section uses a predetermined great feed speed V1 until the leading ends of the thin carrier tape 8B and the embossed carrier tape 8C reach the deceleration start position in front of the tape peeling blade 73 and decelerates the predetermined feed speed V1 to the approximately medium or the small feed speed VM or VL at the peeling start time in the space of time in which the leading ends of the carrier tapes 8B and 8C proceed from the deceleration start position to the tape peeling blade 73. Accordingly, it is possible to attain both the effect of shortening the required time for the automatic loading using the great feed speed V1 until the leading ends of the carrier tapes 8B and 8C reach the deceleration start position, and the effect of increasing the success rate of the peeling start using the approximately medium or the small feed speed VM or VL at the peeling start time.

As a simple method, regardless of the type of the carrier tapes 8, 8A, 8B, and 8C, the predetermined great feed speed V1 until reaching the deceleration start position may be decelerated to the approximately medium or the small feed speed VM or VL at the peeling start time. Even in this method, it is possible to increase the success rate at the peeling start viewed comprehensively. Meanwhile, as a precise method, the feed speed V at the peeling start time may be switchable between more levels than the three levels of the feed speed VH, VM, and VL explained in the embodiments, for example, ten levels.

6. Function of Peeling Start Determination Section, Recovery Function Section, and Recovery Speed Determination Section Next, description will be given of the functions of the peeling start determination section, the recovery function section, and the recovery speed determination section which are configured in the component mounting machine 1 of the embodiment. The component mounting machine 1 of the embodiment aims to swiftly determine the success or failure of the peeling start of the tape peeling mechanism 7 and to reduce the recovery work of the operator by automatically performing the recovery operation when there is a failure at the start of the peeling. In order to realize this, the control device 6 performs a process flow which includes the functions of the peeling start determination section, the recovery function section, and the recovery speed determination section.

As the peeling start determination section, the control device 6 determines whether or not the tape peeling blade 73 enters between the bottom tape 82 or 82C and the cover tape 81 and the peeling is started. As the recovery function section, in a case in which the control device 6 determines that the peeling is not started, the control device 6 carries out the recovery operation in which the leading end of the carrier tape 8, 8A, 8B, or 8C is once returned to in front of the tape peeling blade 73 and the feeding out is performed again. A detailed description will be given below of the process flow of the control device 6.

Figure 9:
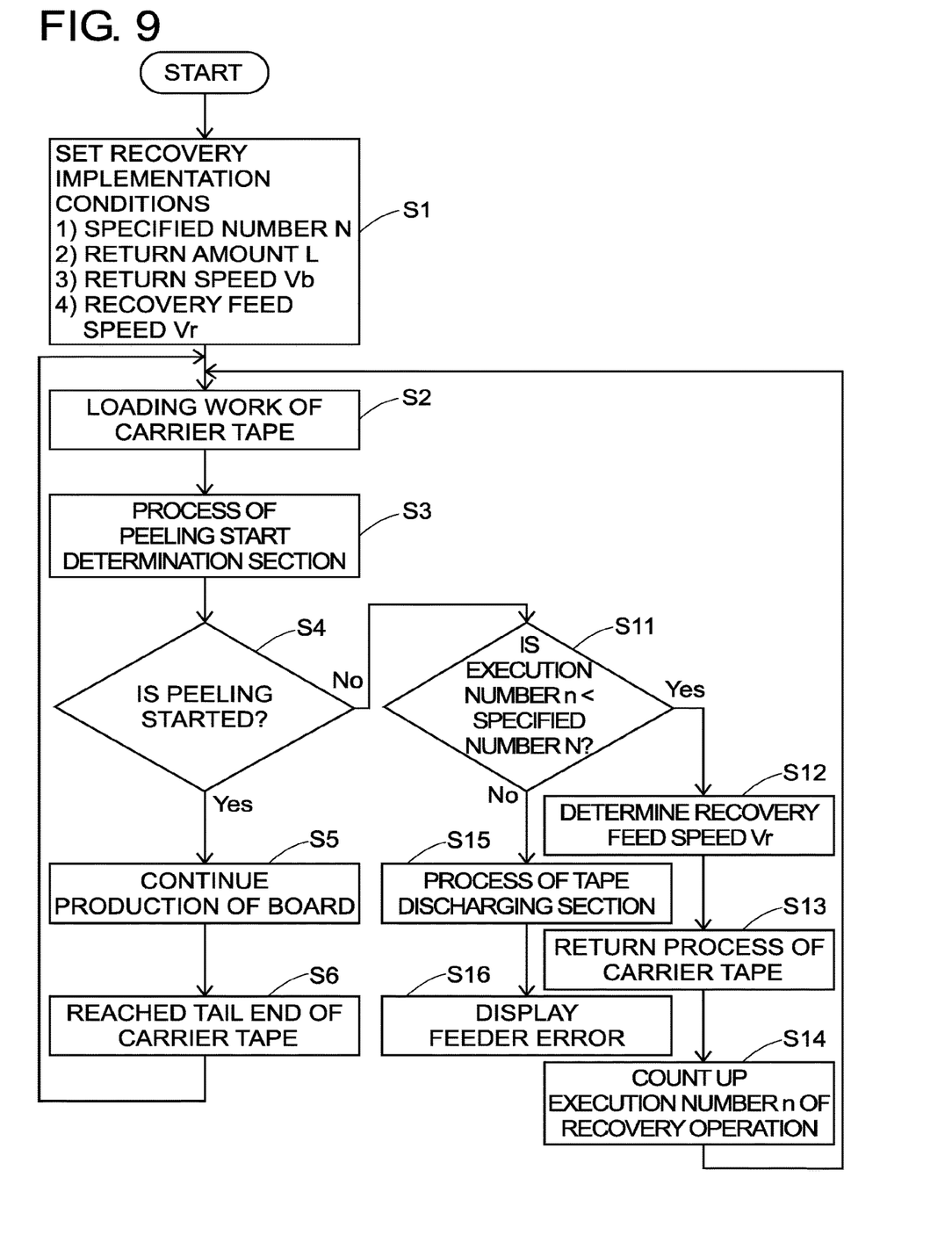
FIG. 9 is a diagram explaining a process flow of the functions of the control device which includes a peeling start determination section, a recovery function section, and a recovery speed determination section.

FIG. 9 is a diagram explaining the process flow of the control device 6 which includes the functions of the peeling start determination section, the recovery function section, and the recovery speed determination section. A portion of the process flow is performed by the operator. In the first step S1 of FIG. 9, the operator sets the changeable recovery implementation conditions. The recovery implementation conditions include specified number N which define the upper limit of execution number n of the recovery operation, a return amount L and a return speed Vb when returning the leading ends of the carrier tapes 8, 8A, 8B, and 8C, and a recovery feed speed Vr when feeding out the leading ends of the carrier tapes 8, 8A, 8B, and 8C again. The recovery implementation conditions may be set commonly in all of the feeder devices 3 and may be set individually in each of the feeder devices 3.

In the next second step S2, the operator sets the feeder device 3 on the pallet table 91 as part of the setup work. Next, the loading work of the carrier tapes 8, 8A, 8B, and 8C is performed. In the first loading work, the operator sets the tape reel 39 in the feeder device 3, inserts the leading end of the carrier tape 8, 8A, 8B, or 8C into the tape insertion port 33, and the following is by the automatic loading function of the feeder device 3. Accordingly, the leading end of the carrier tape 8 is loaded to the stopping position in front of the component supply position 32.

In the next third step S3, the control device 6 uses the image determination section which is realized by the board camera 47 of the mounting head 44 and software to carry out the processes of the peeling start determination section. Specifically, the control device 6 causes the board camera 47 to move in a range from the tape peeling blade 73 to the component supply position 32, images the carrier tape 8, and subjects the captured image to an image process to determine whether or not the peeling is started. For example, it is possible to set four locations of imaging positions P1 and P2 of the tape peeling blade 73, an imaging position P3 of the sprocket hole window 711, and an imaging position P4 of the component supply position 32 which are illustrated in FIG. 3 as the imaging positions to be imaged by the board camera 47. The imaging positions 81 to P4 are accurately positioning-controlled by referring to the position marks 715 and 725. The board camera 47 may image many of the four imaging positions P1 to P4 together, and may image the four imaging positions P1 to P4 individually.

The board camera 47 images the carrier tape 8 at the imaging positions P1 to P4; however, in actuality, a case in which the cover tape 81 is images, a case in which the bottom tape 82 is imaged, and a case in which the configuration members of the tape peeling mechanism 7 other than the carrier tape 8 are imaged occur. For example, it is possible to distinguish these three cases by the changes in luminance of the image. The control device 6 is capable of determining whether or not the peeling is started based on the distinction content. The applicant of the present application has completed the application for the specifics of the technology of determining whether or not the peeling is started according to differences in the luminance of the images of the imaging positions P1 to P4 of the four locations in Japanese Patent Application No. 2014-189203.

In the next fourth step S4, the control device 6 proceeds the performing of the process flow to the fifth step S5 when the start of the peeling is determined, and when this is not the case, proceeds the performing of the process flow to the eleventh step S11. In the fifth step S5, the control device 6 controls the suction and the mounting of the components 89 which are carried out by the suction nozzle 46 and starts and continues the actual production of the board K. When the actual production is continued, in the sixth step S6, the carrier tapes 8, 8A, 8B, or 8C is fed out to the tail end and has a component shortage. Therefore, the operator prepares the new tape reel 39 and returns to the second step S2.

In the eleventh step S11, when the execution number n of the recovery operation is less than the specified number N, the control device 6 proceeds the performing of the process flow to the twelfth step S12. When the execution number n reaches the specified number N, the control device 6 determines a recovery unsuccessful time in which the failure of the peeling start is not alleviated and proceeds the performing of the process flow to the fifteenth step S15.

In the twelfth step S12, the control device 6 functions as the recovery speed determination section, and every time it is determined that the peeling is not started, the control device 6 progressively slows the recovery feed speed Vr from the feed speed V at the peeling start time. For example, the control device 6 sets the recovery feed speed Vr to a magnitude of 90% of the feed speed V at the peeling start time in the recovery operation of the first time, and from the second time, progressively slows the recovery feed speed Vr in increments of 10% as in 80%, 70%, 60%.

The next thirteenth step S13 is a return process of the carrier tape 8, 8A, 8B, or 8C which is performed when the peeling start fails and the execution number n of the recovery operation is less than the specified number N. The control device 6 controls the tape feeding mechanism to be driven in the reverse direction and uses the return speed Vb which is set in the first step S1 to return the carrier tape 8 by the return amount L which is set to the front side.

In the next fourteenth step S14, the control device 6 counts up the execution number n of the recovery operation by one and returns the performing of the process flow to the second step S2. In the second step S2 when returning from the fourteenth step S14, the control device 6 causes the automatic loading function of the carrier tape 8 to work without intervention from the operator. In other words, the control device 6 uses the recovery feed speed Vr which is determined in the twelfth step S12 to perform control such that the carrier tape 8 is fed out again by the return amount L. Subsequently, the third step S3 onward is repeated. The recovery function section of the present disclosure is realized by the eleventh step S11, the thirteenth step S13, the fourteenth step S14, and the second step S2.

In the fifteenth step S15 when the recovery unsuccessful, the control device 6 causes the automatic discharge function which corresponds to the tape discharging section to work. Accordingly, the leading end of the carrier tape 8, 8A, 8B, or 8C is discharged to the vicinity of the tape insertion port 33. In the next sixteenth step S16, the control device 6 displays a feeder error to notify the operator.

The control device 6 stores the feed speed V of the time at which it is determined that the peeling is started in the first loading work of the carrier tape 8, 8A, 8B, or 8C as a set with the types of the carrier tape 8, 8A, 8B, or 8C. The control device 6 stores the recovery feed speed Vr of the time at which it is determined that the peeling is started by the recovery operation as a set with the type of the carrier tapes 8, 8A, 8B, or 8C. When mounting the next carrier tape 8, 8A, 8B, or 8C of the same type, the control device 6 uses the stored feed speed V or the stored recovery feed speed Vr as the feed speed V of the peeling start time.

7. Modes and Effects of Component Mounting Machine 1 of Embodiment

The component mounting machine 1 of the embodiment includes the feeder device 3 of the embodiment, the component transfer device 4 which includes the mounting head 44 which has the suction nozzle 46 which sucks the components 89 at the component supply position 32 and mounts the components 89 onto a board, and a head driving mechanism which drives the mounting head 44, a peeling start determination section which determines whether or not the tape peeling blade 73 enters between the bottom tape 82 or 82C and the cover tape 81 and the peeling is started, and a recovery function section which carries out a recovery operation of once returning the leading end of the carrier tape 8, 8A, 8B, or 8C to in front of the tape peeling blade 73 and feeding out the leading end of the carrier tape 8, 8A, 8B, or 8C again in a case in which the peeling start determination section determines that the peeling is not started.

Accordingly, since the component mounting machine 1 is provided with the peeling start determination section and the recovery function section, hypothetically, even if the peeling fails, the recovery operation is automatically performed and the success rate of the peeling start is further increased.

Furthermore, the peeling start determination section is configured to include the board camera 47 which is provided on the mounting head 44 and images a position fiducial mark of the board K, and an image determination section which moves the board camera 47 in a range from the tape peeling blade 73 to the component supply position 32, images the carrier tape 8, 8A, 8B, or 8C, subjects the captured image to an image processing, and determines whether or not the peeling is started. Accordingly, it is possible to combine the preexisting board camera 47 and the software of the control device 6 to configure the peeling start determination section, and since a sensor or the like may not be added, a rise in the cost is reduced.

Furthermore, in the recovery function section, the recovery feed speed Vr at a time at which the leading end of the carrier tape 8, 8A, 8B, or 8C comes into contact with the tape peeling blade again is included in recovery implementation conditions which are changeable, and the recovery function section includes a recovery speed determination section which progressively slows the recovery feed speed Vr from the feed speed V at the peeling start time every time that the peeling start determination section determines that the peeling is not started. Accordingly, since the recovery feed speed Vr progressively slows, cases in which the recovery operation succeeds at the peeling start increase and it is possible to notably increase the success rate of the peeling start.

Furthermore, the feed speed determination section sets the recovery feed speed Vr at the time at which the peeling start determination section determines that the peeling is started to the feed speed V of the peeling start time of the next carrier tape 8, 8A, 8B, or 8C of the same type. Accordingly, the feed speed determination section is provided with a learning function with respect to the feed speed V. In other words, the feed speed determination section holds the accurate feed speed V for which there is a record of success at the peeling start for each type of the carrier tape 8, 8A, 8B, or 8C and is capable of using the suitable feed speed V from the first loading work.

8. Adaptations and Modification of Embodiment

In the feeder device 3 of the embodiment, the deceleration start position is not limited to the installation position of the tape detection sensor 36. For example, the deceleration start position may be set closer to the front than the tape detection sensor 36, and deceleration may be started after the leading end of the carrier tape 8, 8A, 8B, or 8C proceeds a fixed distance from the tape detection sensor 36. For example, the deceleration start position may be set closer to the rear than the tape detection sensor 36, and deceleration may be started at a point in time at which the leading end of the carrier tape 8, 8A, 8B, or 8C proceeds a fixed distance from the fourth sprocket 354.

In the component mounting machine of the embodiment, the peeling start determination section may determine the success of the peeling start based on the fact that the suction nozzle 46 succeeds to suck the component 89 after the loading work of the carrier tape 8, 8A, 8B, or 8C. It is possible to apply various other adaptations and modifications to the present disclosure.

REFERENCE SIGNS LIST

1: component mounting machine, 2: board conveyance device, 3: feeder device, 32: component supply position, 4: component transfer device, 44: mounting head, 46: suction nozzle, 47: board camera, 5: component camera, 6: control device, 7: tape peeling mechanism, 73: tape peeling blade, 8, 8A, 8B: carrier tape, 8C: embossed carrier tape, 81: cover tape, 82, 82C: bottom tape, 83, 83C: component storage section, 89: component, 9: device table

The invention claimed is:

1. A feeder device, comprising:
   a tape feeding mechanism configured to feed out, at a feed speed, a carrier tape which includes a bottom tape which stores components in corresponding multiple component storage sections and a cover tape which is adhered to the bottom tape and covers the component storage sections, the feeder device supplying the components from the component storage sections at a component supply position;
   a tape peeling mechanism which includes a tape peeling blade configured to peel at least a portion of the cover tape from the bottom tape as the carrier tape is fed out; and
   a feed speed determination section configured to determine the feed speed at a peeling start time at which a leading end of the carrier tape comes into contact with the tape peeling blade according to a determination of at least one of a type of carrier tape fed to the component supply position and a type of the components stored in the component storage sections.

2. The feeder device according to claim 1,
   wherein the feed speed determination section uses a predetermined feed speed until a leading end of the carrier tape reaches a deceleration start position in front of the tape peeling blade and decelerates the predetermined feed speed to a feed speed at the peeling start time in the space of time in which the leading end of the carrier tape proceeds from the deceleration start position to the tape peeling blade.

3. A component mounting machine, comprising:
   the feeder device according to claim 1;
   a component transfer device which includes a mounting head which has a suction nozzle configured to suck the components at the component supply position and configured to mount the components onto a board;
   a head driving mechanism which drives the mounting head;
   a peeling start determination section configured to determine whether or not the tape peeling blade enters between the bottom tape and the cover tape and whether the peeling is started; and
   a recovery function section configured to carry out a recovery operation of once returning the leading end of the carrier tape to in front of the tape peeling blade and feeding out the leading end of the carrier tape again in a case in which the peeling start determination section determines that the peeling is not started.

4. The component mounting machine according to claim 3,
   wherein the peeling start determination section includes
   a camera which is provided on the mounting head and configured to image a position fiducial mark of the board, and
   an image determination section which moves the camera in a range from the tape peeling blade to the component supply position, images the carrier tape, subjects the captured image to an image processing, and determines whether or not the peeling is started.

5. The component mounting machine according to claim 3,
   wherein in the recovery function section, a recovery feed speed at a time at which the leading end of the carrier tape comes into contact with the tape peeling blade again is included in recovery implementation conditions which are changeable, and
   wherein the recovery function section includes a recovery speed determination section which progressively slows the recovery feed speed from the feed speed at the peeling start time every time that the peeling start determination section determines that the peeling is not started.

6. The component mounting machine according to claim 5,
   wherein the feed speed determination section sets a recovery feed speed at the time at which the peeling start determination section determines that the peeling is started to a feed speed of the peeling start time of the next carrier tape of the same type.

* * * * *